United States Patent [19]
Fujii et al.

[11] Patent Number: 5,436,583
[45] Date of Patent: Jul. 25, 1995

[54] TIMING SIGNAL GENERATING CIRCUIT

[75] Inventors: Norio Fujii, Kyoto; Takahiro Sakaguchi, Tokyo, both of Japan

[73] Assignees: Rohm Co., Ltd., Kyoto; Teac Corporation, Tokyo, both of Japan

[21] Appl. No.: 248,887

[22] Filed: May 25, 1994

[30] Foreign Application Priority Data

May 25, 1993 [JP] Japan .................. 5-122612

[51] Int. Cl.⁶ .................. H03K 3/017; H03K 5/05
[52] U.S. Cl. .................. 327/165; 327/75; 327/336; 327/345; 327/561
[58] Field of Search .................. 360/51, 46, 73.03; 327/172, 77, 334, 336, 74, 75, 165, 173, 174, 175, 291, 344, 72, 73, 345, 561

[56] References Cited

U.S. PATENT DOCUMENTS

| | | | |
|---|---|---|---|
| 4,138,615 | 2/1979 | McKinlay | 327/345 X |
| 4,939,395 | 7/1990 | Asano et al. | 327/561 X |
| 5,371,635 | 12/1994 | Sakaguchi et al. | 360/73.03 |

*Primary Examiner*—Aristotelis Psitos
*Assistant Examiner*—Patrick Wamsley
*Attorney, Agent, or Firm*—Nikaido, Marmelstein, Murray & Oram

[57] ABSTRACT

A reference period generating circuit is provided which generates a pulse having a width corresponding/to a reference period $T_1$ in response to the input of a trigger pulse. A switch, a first resistor and a second resistor are connected in series between the first and second reference voltages. The node between the first and second resistors is connected to an inverting terminal of an operational amplifier. A non-inverting terminal thereof is connected to a third reference voltage. A clamping circuit is provided to clamp the output voltage of the operational amplifier to a predetermined value. By comparing the output voltage with a predetermined reference value by means of a comparator, a pulse representative of a timing period is generated.

5 Claims, 6 Drawing Sheets

(a)

(b)

(c)

Vref2

(d)

TIMING SIGNAL GENERATING CIRCUIT

BACKGROUND OF THE INVENTION

1. Field of the Invention

The present invention relates to a timing signal generating circuit for use in various apparatuses.

2. Description of the Prior Art

For example in a floppy disk drive (FDD), one pulse signal is generated every rotation of the disk to decide the start position of recording on the disk rotated by a motor. It is necessary for this signal to be generated at a particular speed of the disk so that the compatibility of the disk is obtained, which is realized by a timing adjustment based on a reference value and the precision of its permissible range.

Referring to FIG. 1, there is shown a conventional timing signal generating circuit. Reference numeral 20 represents a comparator. Reference numeral 21 represents a latch circuit. Reference numeral 22 represent a switching transistor. To an inverting terminal (−) of the comparator 20, a reference voltage $V_{ref2}$ is supplied. To a non-inverting terminal (+) thereof, a voltage of a capacitor C is applied.

When a trigger pulse P is inputted to the latch circuit 21 under a condition where the output of the latch circuit 21 is of high level, the output of the latch circuit 21 is inverted to low level as shown in (b) of FIG. 2. Consequently, the transistor 22 is disabled, so that the capacitor C is charged by a current flowing from a line 23 of the reference voltage $V_{ref1}$ through a resistor R to increase the voltage across the capacitor C as shown in (c) of FIG. 2. This voltage is inputted to the non-inverting terminal (+) of the comparator 20. When this voltage reaches the reference voltage $V_{ref2}$, an output of the comparator 20 becomes of high level. In response thereto, the output of the latch circuit 21 is inverted to high level.

When the output of the latch circuit 21 becomes of high level, the transistor 22 is activated to rapidly discharge the capacitor C, so that the voltage of the capacitor C becomes of low level to change the level of output of the comparator 20 to low level. As a result, the output of the comparator 20 is a narrow pulse as shown in (d) of FIG. 2. The output obtained from an output terminal 24 (in this case, the output of the latch circuit 21) is as shown in (b) of FIG. 2, and the timing period is a period T corresponding to the output pulse width.

In this conventional circuit, however, if the values of the resistor R and the capacitor C vary with temperature variation and with time, the timing period T varies. Specifically, in the conventional circuit, since the timing period T is obtained by $$T = -CR \ln\left(1 - \frac{V_{ref2}}{V_{ref1}}\right),$$

by making $V_{ref2}/V_{ref1}$ constant, T depends on the values of the capacitor C and the resistor R. In other words, the above expression implies that the timing period T largely varies according to the variation in the values of the capacitor C and the resistor R. For this reason, in the conventional circuit, it is necessary to use as the resistor R and as the capacitor C a resistor and a capacitor which show only extremely slight variation with temperature variation and with time. This is very inconvenient.

SUMMARY OF THE INVENTION

An object of the present invention is to provide a timing signal generating circuit where the timing period does not vary even if the values of the resistor and the capacitor vary.

To achieve the above-mentioned object, a timing signal generating circuit of the present invention is provided with the following: a first reference voltage; a second reference voltage; a third reference voltage; a circuit including a switch, a first resistor and a second resistor connected in series between the first and second reference voltages; a first pulse generating circuit to which a trigger signal is supplied and which generates a pulse for turning said switch on or off for a predetermined period from a time when the trigger signal is supplied; an operational amplifier which has a first input terminal connected to a node between said first and second resistors and to an output terminal of said operational amplifier through a capacitor, and a second input terminal coupled to said third reference voltage; a clamping circuit which allows an output voltage of said operational amplifier to vary while said capacitor is being charged and discharged, and clamps the output voltage of the operational amplifier to a predetermined voltage value while the capacitor is not being charged or discharged; and a second pulse generating circuit which generates a pulse having a width corresponding to a period during which the output voltage of the operational amplifier varies from the predetermined voltage value. The output pulse of the second pulse generating circuit is used as a timing signal.

According to such features, the timing period T based on the timing signal is obtained by $$T = \frac{R_2}{R_1}\left(\frac{V_{ref1} - V_{ref3}}{V_{ref3} - V_{ref2}}\right)T_1$$

where $V_{ref1}$, $V_{ref2}$ and $V_{ref3}$ represent first, second and third reference voltages, $R_1$ and $R_2$ represent first and second resistors, and $T_1$ represent a reference period. The capacitor has nothing to do with the period T, but only the ratio of the resistors and the ratio of the differences of the reference voltages together with the reference period $T_1$ affect the period T. As a result, even if the absolute values of the resistors and the reference voltages vary, the timing period T never varies as far as the relative values of the resistors and the reference voltages do not vary.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
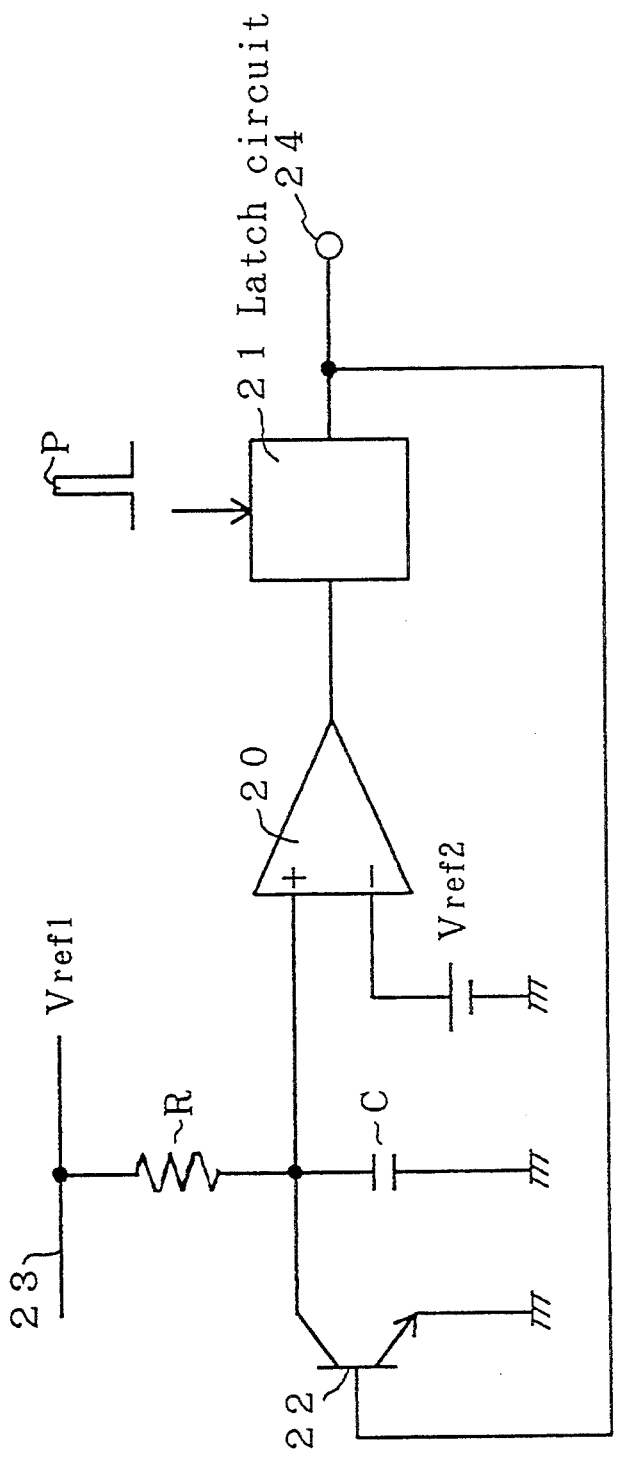
FIG. 1 is a circuit diagram of a conventional timing signal generating circuit.
Figure 2:
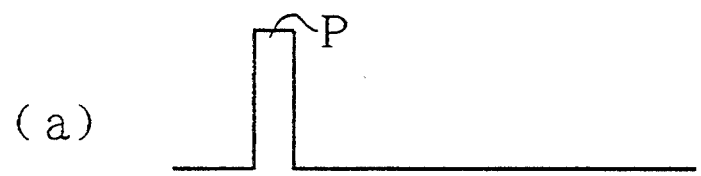
FIG. 2 is a signal waveform chart of assistance in explaining the operation of the circuit of FIG. 1.
Figure 2:
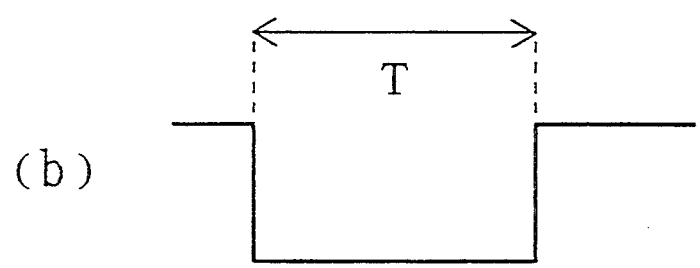
Figure 2:
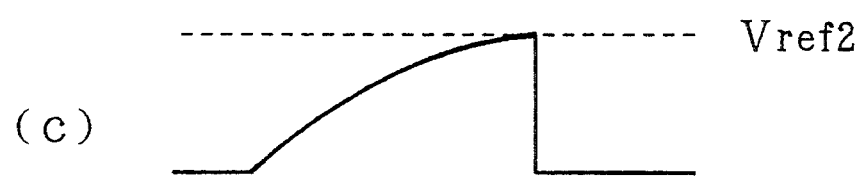
Figure 2:
Figure 3:
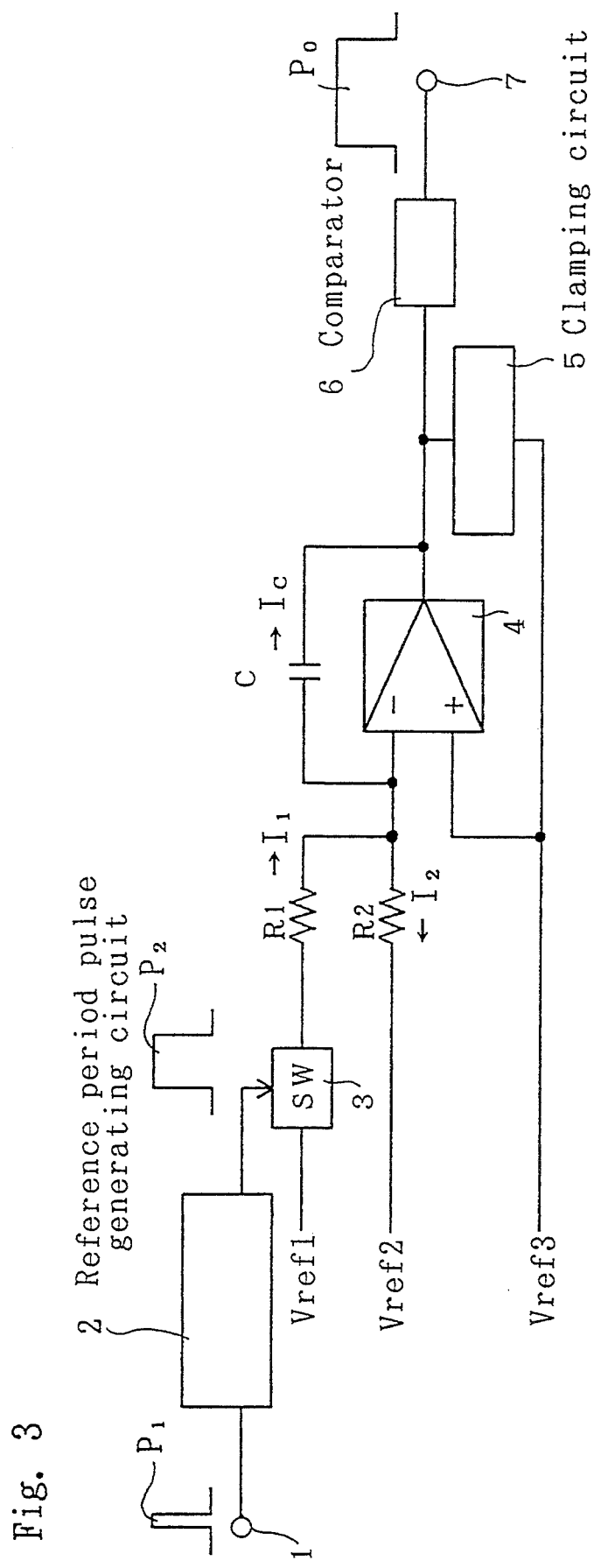
FIG. 3 is a block diagram of a timing signal generating circuit embodying the present invention.

Referring to FIG. 3, there is shown a block diagram of an embodiment of the present invention. Reference numeral 1 represents a trigger pulse input terminal. Reference numeral 2 represents a reference period pulse generating circuit which outputs a pulse $P_2$ having a width corresponding to a reference period $T_1$ in response to the input of a trigger pulse $P_1$. $V_{ref1}$, $V_{ref2}$ and $V_{ref3}$ represent first, second and third reference voltages, respectively. Between the first and second reference voltages $V_{ref1}$ and $V_{ref2}$, a switch 3, a first resistor $R_1$ and a second resistor $R_2$ are connected in series. The node between the first and second resistors $R_1$ and $R_2$ is connected to an inverting terminal (−) of an operational amplifier 4.

A non-inverting terminal (+) of the operational amplifier 4 is connected to the third reference voltage $V_{ref3}$. Reference numeral 5 represents a clamping circuit which clamps an output voltage of the operational amplifier 4 to a predetermined value. Reference numeral 6 represents a comparator which compares the output voltage of the operational amplifier 4 with a predetermined reference value to generate a pulse $P_0$. Reference numeral 7 represents an output terminal.

When the trigger pulse $P_1$ is inputted through the terminal 1 to the reference period pulse generating circuit 2, the reference period pulse generating circuit 2 generates the pulse $P_2$ having a width corresponding to the period $T_1$ from the time when the trigger pulse $P_1$ rises. The pulse $P_2$ is also shown in (a) of FIG. 4. The pulse $P_2$ is supplied to the switch 3 so that the switch 3 is ON during the period $T_1$. Consequently, during the period $T_1$, the inverting terminal (−) of the operational amplifier 4 is connected to the reference voltage $V_{ref2}$ through the resistor $R_2$ and to the reference voltage $V_{ref1}$ through the resistor $R_1$ and the switch 3.

Figure 4A:
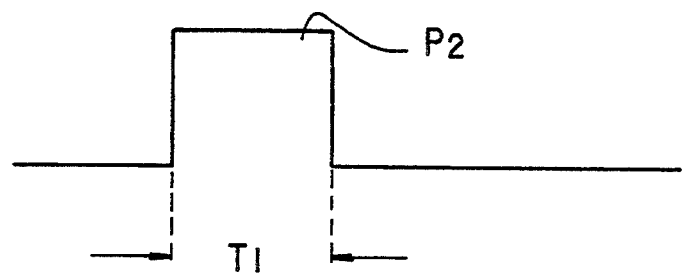
FIG. 4 is a signal waveform chart of assistance in explaining the operation of FIG. 1.
Figure 4B:
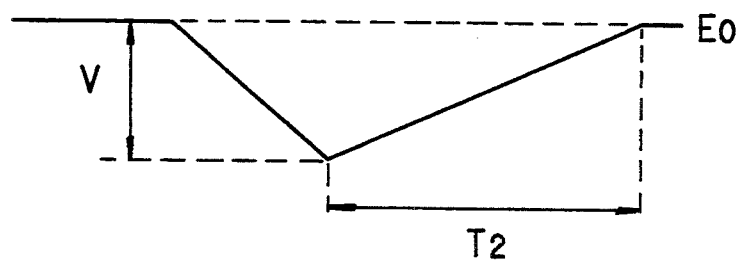
Figure 4C:
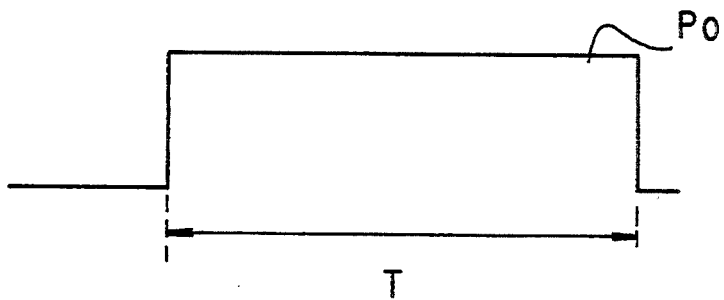

Before the switch 3 is turned on, the output voltage of the operational amplifier 4 is clamped by the clamping circuit 5 to a level $E_0$ shown in (b) of FIG. 4. When the switch 3 is turned on, a current $I_c = I_1 - I_2$ flows through the capacitor C, so that the output voltage decreases. In this case, $V_{ref1} > V_{ref2}$. Hence, a change V in the output voltage during the period $T_1$ is $$V = \frac{T_1}{C}\left(\frac{V_{ref1} - V_{ref3}}{R_1} - \frac{V_{ref3} - V_{ref2}}{R_2}\right)$$

When the switch 3 is turned off then, since the current flows in a reverse direction through the capacitor C, the output voltage increases. When the output voltage reaches the level $E_0$, it is clamped to $E_0$ by the clamping circuit 5. When this period is $T_2$ as shown in (b) of FIG. 4, during the period $T_2$, V is represented by $$V = \frac{T_2}{C} \cdot \frac{V_{ref3} - V_{ref2}}{R_2}$$

Hence, $$T_2 = \frac{R_2}{R_1}\left(\frac{V_{ref1} - V_{ref3}}{V_{ref3} - V_{ref2}} - 1\right)T_1$$

The timing period $T = T_1 + T_2$ is, $$T = \frac{R_2}{R_1} \frac{V_{ref1} - V_{ref3}}{V_{ref3} - V_{ref2}} T_1 \quad (1)$$

In this case, the timing period T depends on the ratio $R_2/R_1$, the ratio $(V_{ref1} - V_{ref3})/(V_{ref3} - V_{ref2})$ and the reference timing $T_1$. Even if the values of the resistors $R_1$ and $R_2$ vary, the timing period T is not affected by the variation in the resistance values as far as the ratio of the resistance values does not vary. Regarding the reference voltage, the period T is not affected as far as the ratio $(V_{ref1} - V_{ref3})/(V_{ref3} - V_{ref2})$ does not vary.

Figure 5:
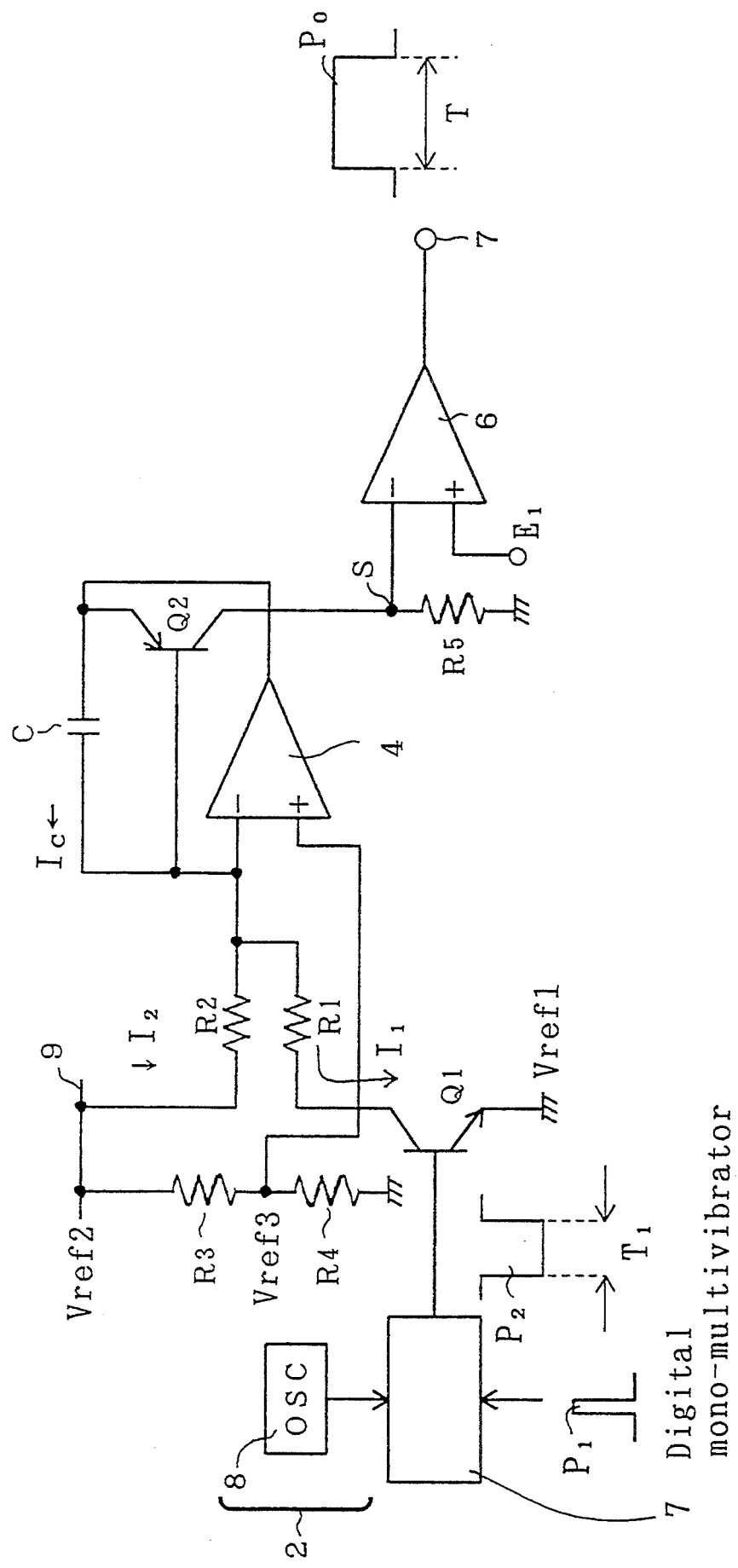
FIG. 5 shows a specific arrangement of a timing signal generating circuit of the present invention.

Referring to FIG. 5, there is shown a specific embodiment of the present invention. The reference period generating circuit 2 including a digital mono-multivibrator 7 and an oscillation circuit 8 generates a negative polarity pulse $P_2$ having a width corresponding to the reference period $T_1$ in response to the input of the trigger pulse $P_1$. In this circuit, the switch 3 comprises an npn-type transistor $Q_1$, and the reference voltage $V_{ref1}$ is a ground potential. To a power supply line 9, the reference voltage $V_{ref2}$ is supplied. The voltage obtained by dividing the reference voltage $V_{ref2}$ through resistors $R_3$ and $R_4$ is the reference voltage $V_{ref3}$. In this embodiment, $V_{ref1} < V_{ref2}$, and the clamping circuit 5 comprises a pnp-type transistor $Q_2$.

When the trigger pulse $P_1$ is not inputted, the transistor $Q_1$ is activated and a current $I_1 - I_2 = I_c$ flows, so that the capacitor C is charged. When the voltage of the capacitor C becomes the same as a conducting voltage $V_{BE}$ between the emitter and base of the transistor $Q_2$, the charging of the capacitor C is stopped, so that the current $I_c$ becomes $I_c = 0$. Under that condition, since the transistor $Q_2$ is ON, the current corresponding to $I_1 - I_2$ flows as the base current of the transistor $Q_2$. When the transistor $Q_2$ is ON, the output voltage of the operational amplifier 4 is $V_{ref3} + V_{BE}$. The potential at a point S (collector of the transistor $Q_2$) takes a value close thereto.

Figure 6A:
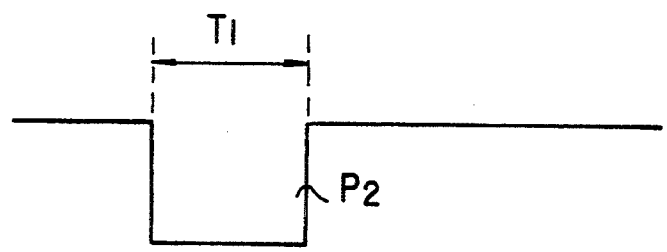
FIG. 6 is a signal waveform chart of assistance in explaining the operation of the circuit of FIG. 5.
Figure 6B:
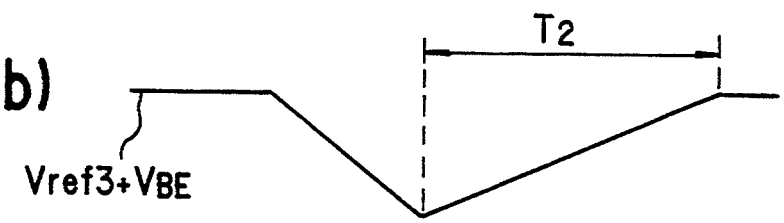
Figure 6C:
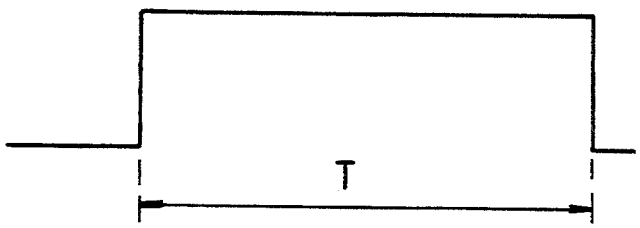

Under this condition, when the trigger pulse $P_1$ is inputted to the digital mono-multivibrator 7 to generate the negative polarity pulse $P_2$, the transistor $Q_1$ is disabled, so that the current $I_2$ flows into the capacitor C to charge the capacitor C. The transistor $Q_2$ is disabled at the time of period when the current $I_2$ starts to flow into the capacitor C. The output voltage of the amplifier 4 decreases according to a time constant decided by the resistor $R_2$ and the capacitor C. When the pulse $P_2$ terminates, the transistor $Q_1$ is activated, so that the current $I_1 - I_2 = I_c$ flows into the capacitor C to charge the capacitor C. For this reason, the output voltage of the amplifier 4 increases according to a time constant decided by the resistors $R_1$ and $R_2$ and the capacitor C. When the capacitor C is charged to the voltage $V_{BE}$, the transistor $Q_2$ is activated and the charging is stopped, so that the output voltage of the amplifier 4 is clamped to $V_{ref3} + V_{BE}$. While the transistor $Q_2$ is OFF, the point S is of ground level, so that the positive pulse $P_0$ is generated in the output of the comparator 6. In FIG. 6, (a) shows the pulse $P_2$, (b) shows the variation in output voltage of the amplifier 4, and (c) shows the output voltage of the comparator 6.

Substituting $V_{ref1}=0$ and $V_{ref3}=\{R_4/(R_3+R_4)\}V_{ref2}$ in the above expression (1), $$T = T_1 \times \frac{R_2}{R_1} \times \frac{R_4}{R_3}$$

In this case, the timing period T is not affected by the reference voltages but only depends on the ratio of $R_1$ to $R_2$ and the ratio of $R_3$ to $R_4$.

When the circuit of the present invention is employed in a FDD, a pulse obtained one per rotation from a Hall device of a motor which rotates the disk is supplied to the input terminal 1 as the trigger pulse. In synchronism with the fall of the timing pulse $P_0$ outputted to the output terminal 7, a command for information on the disk to be read is supplied to a reading circuit of the FDD, for example, from a microcomputer (not shown). With this arrangement, a predetermined relationship can be established between the rotation of the motor (therefore, the rotation of the disk) and the reading of the information; the width T of the pulse $P_0$ realizes the relationship. When the information is recorded onto the disk, the timing is performed in a similar manner.

As described above, according to the present invention, since the timing period is not affected by the capacity of the capacitor of the operational amplifier and the circuit factors on which the timing period depend are in the form of ratio, even if the absolute values of the resistors vary, the timing period does not vary as far as the relative values of the resistors do not vary. As a result, it is unnecessary to use parts which shows extremely slight variation with temperature variation and with time, and a highly reliable timing signal is obtained.

Obviously, many modifications and variations of the present invention are possible in light of the above teachings. It is therefore to be understood that within the scope of the appended claims, the invention may be practiced other than as specifically described.

What is claimed is:

1. A timing signal generating circuit comprising:
    a first reference voltage;
    a second reference voltage;
    a third reference voltage;
    a circuit including a switch, a first resistor and a second resistor connected in series between the first and second reference voltages;
    a first pulse generating circuit to which a trigger signal is supplied, said first pulse generating circuit generating a pulse for changing a condition of said switch for a predetermined period from a time when the trigger signal is supplied;
    an operational amplifier which has a first input terminal connected to a node between said first and second resistors and to an output terminal of said operational amplifier through a capacitor, and a second input terminal coupled to said third reference voltage;
    a clamping circuit which allows an output voltage of said operational amplifier to vary while said capacitor is being charged and discharged, said clamping circuit clamping the output voltage of the operational amplifier to a predetermined voltage value while the capacitor is not being charged or discharged; and
    a second pulse generating circuit which generates as a timing signal a pulse having a width corresponding to a period during which the output voltage of the operational amplifier varies from the predetermined voltage value.

2. A timing signal generating circuit according to claim 1, wherein said first pulse generating circuit generates a pulse for a changeover of said switch between a condition where either of said first and second resistors is activated and a condition where both of the first and second resistors are activated.

3. A timing signal generating circuit according to claim 1, wherein said first reference voltage is a ground potential and wherein said third reference voltage is obtained by dividing the second reference voltage through a plurality of resistors.

4. A timing signal generating circuit according to claim 1, wherein said clamping circuit has a transistor having an emitter connected to one end of the capacitor and a base connected to another end of the capacitor, wherein a collector of said transistor is connected to ground through a resistor, and wherein a voltage generated at said collector is supplied to the second pulse generating circuit.

5. A floppy disk drive apparatus having a timing signal generating circuit, said timing signal generating circuit comprising:
    a first reference voltage;
    a second reference voltage;
    a third reference voltage;
    a circuit including a switch, a first resistor and a second resistor connected in series between the first and second reference voltages;
    a first pulse generating circuit to which a trigger signal is supplied, said first pulse generating circuit generating a pulse for changing a condition of said switch for a predetermined period from a time when the trigger signal is supplied;
    an operational amplifier which has a first input terminal connected to a node between said first and second resistors and to an output terminal of said operational amplifier through a capacitor, and a second input terminal coupled to said third reference voltage;
    a clamping circuit which allows an output voltage of said operational amplifier to vary while said capacitor is being charged and discharged, said clamping circuit clamping the output voltage of the operational amplifier to a predetermined voltage value while the capacitor is not being charged or discharged; and
    a second pulse generating circuit which generates as a timing signal a pulse having a width corresponding to a period during which the output voltage of the operational amplifier varies from the predetermined voltage value.

* * * * *